United States Patent
Kazama

(10) Patent No.: US 6,323,667 B1
(45) Date of Patent: Nov. 27, 2001

(54) CONTACT PROBE UNIT

(75) Inventor: Toshio Kazama, Nagano (JP)

(73) Assignee: NHK Spring Co., Ltd., Yokohama (JP)

( * ) Notice: Subject to any disclaimer, the term of this patent is extended or adjusted under 35 U.S.C. 154(b) by 0 days.

(21) Appl. No.: 09/331,806

(22) PCT Filed: Dec. 26, 1997

(86) PCT No.: PCT/JP97/04877

§ 371 Date: Jun. 24, 1999

§ 102(e) Date: Jun. 24, 1999

(87) PCT Pub. No.: WO98/29751

PCT Pub. Date: Jul. 9, 1998

(30) Foreign Application Priority Data

Dec. 27, 1996 (JP) .................................... 8-350680
Jul. 4, 1997 (JP) .................................... 9-180016

(51) Int. Cl.⁷ .................................................. G01R 31/02
(52) U.S. Cl. .......................... 324/761; 324/754; 324/757
(58) Field of Search ................................... 324/761, 754, 324/757, 158.1, 758

(56) References Cited

U.S. PATENT DOCUMENTS

| 4,931,726 | 6/1990 | Kasukabe et al. ............... 324/158 F |
| 5,003,255 | * 3/1991 | Kazama ............................... 324/756 |
| 5,990,697 | * 11/1999 | Kazama ............................... 324/761 |

FOREIGN PATENT DOCUMENTS

| 3340431A | 5/1985 | (DE) .......................... H01R/11/18 |
| 64-71141 | 3/1989 | (JP) . |
| 3-202780 | 9/1991 | (JP) . |
| 06148236 | 5/1994 | (JP) . |
| 06201725 | 7/1994 | (JP) . |
| 07115253 | 5/1995 | (JP) . |
| 08023013 | 1/1996 | (JP) . |
| 08039855 | 2/1996 | (JP) . |
| 09054116 | 2/1997 | (JP) . |
| 10019930 | 1/1998 | (JP) . |
| 10038920 | 2/1998 | (JP) . |
| 10111315 | 4/1998 | (JP) . |

OTHER PUBLICATIONS

"Spring Plunger Contact Assembly", Hobart, F. (Western Electric Technical Digest, No. 35, Jul. 1974, pp. 33–34).*

* cited by examiner

Primary Examiner—Glenn W. Brown
Assistant Examiner—Anjan K Deb

(57) ABSTRACT

In an electroconductive contact probe unit, the electroconductive needle member is axially slidably received in a support hole formed in an insulating support plate, and is urged by the compression coil spring wound around a stem portion of the electroconductive needle member in a direction to project out of the support hole. The inner end of the compression coil spring is provided with a closely wound portion in which adjacent turns of the coil wire contact each other in the free state of the compression coil spring. As the support plate is lowered toward the object to be tested and the compression coil spring is compressed, the compression coils snakes or otherwise curves in the support hole, causing the inner surface of the closely wound portion to come into contact with the outer circumferential surface of the stem portion. Thus, the electric signal is conducted axially through the closely wound portion, instead of the spiral path along a coarsely wound portion of the compression coil spring so that the inductance and the electric resistance of the contact probe unit can be reduced. At the same time, the coarsely wound portion of the compression coil spring provides the necessary spring force for the needle member.

20 Claims, 7 Drawing Sheets

CONTACT PROBE UNIT

TECHNICAL FIELD

The present invention relates to an electroconductive contact probe unit for testing printed circuit boards, semiconductor devices and semiconductor wafers by using an electroconductive needle member resiliently urged by a compression coil spring.

BACKGROUND ART

According to a conventionally known electroconductive contact probe unit for use in a contact probe for electrically testing electroconductive patterns of printed circuit boards and semiconductor products, each electroconductive needle member is received in a tubular holder so as to be axially slidable in and out of the holder and is resiliently urged by a compression coil spring in the direction to project out of the holder to the extent permitted by an arrangement for preventing the electroconductive needle member from completely projecting out of the holder. In such an electroconductive contact probe unit, a forward end of the electroconductive needle member is resiliently engaged with an object to be tested so that an electric signal may be transmitted between the object to be tested and an external circuit such as a testing circuit.

However, during the testing process, when electric current from the object to be tested is conducted through the compression coil spring via the electroconductive needle member, the electric signal encounters an inductance which is proportion to the square of the number of turns of the compression coil spring. Therefore, when the electric signal that is conducted through the contact probe unit consists of a high frequency signal (for instance in the range of several tens of MHz to several GHz), the high frequency signal is conducted along the spiral path of the compression coil spring, and the resulting increases in the inductance and electric resistance may corrupt the electric properties of the detected signal.

DISCLOSURE OF INVENTION

In view of such problems of the prior art, a primary object of the present invention is to provide an electroconductive contact probe unit which is reliable in use, and can handle high frequency signals.

A second object of the present invention is to provide an electroconductive contact probe unit which is low in inductance and electric resistance.

A third object of the present invention is to provide an electroconductive contact probe unit which is simple in structure and economical to manufacture.

A fourth object of the present invention is to provide an electroconductive contact probe unit which can establish a favorable electric contact even when the surface of the object to be tested is covered by oxide film or other foreign matters.

According to the present invention, these and other objects of the present invention can be accomplished by providing an electroconductive contact unit, comprising: a support hole passed through a support member; an electroconductive needle member slidably received in the support hole, the needle member including a head portion projecting out of an end of the support hole, and a stem portion extending from the head portion coaxially and away from an end of the head portion projecting out of the support hole; and a compression coil spring coaxially received in the support hole so as to urge the head portion out of the support hole; the compression coil spring including a closely wound portion in which adjacent turns of the compression coil spring contact each other at least when the compression coil spring is compressed to a certain extent; the closely wound portion has an outer diameter substantially smaller than an inner diameter of a corresponding part of the support hole so that the closely wound portion curves as the compression coil is compressed; the stem portion overlapping the closely wound portion of the compression coil spring so that the stem portion comes into contact with the closely wound portion when the compression coil spring is compressed and the closely wound portion has thereby curved at least to a certain extent.

Thus, the electric signal conducted by the compression coil spring is allowed to pass axially through the closely wound portion, instead of conducting the electric signal through a spiral path along a coarsely wound portion of the compression coil spring, and thereby suffering from the increases in the inductance and the electric resistance. At the same time, the coarsely wound portion of the compression coil spring provides the necessary spring force for the needle member. Preferably, the closely wound portion is located in such a manner that the closely wound portion axially overlaps a rear end of the electroconductive needle member under a rest condition where the electroconductive needle member is not in contact with any object.

To ensure that the closely wound portion of the compression coil spring allows the electric current to be conducted axially through the length of the compression coil spring, electroconductive film may be deposited around the closely wound portion to form the closely wound portion into a substantially integral tube.

According to a typical arrangement for a contact probe unit, the electroconductive needle member further comprises a large diameter portion between the head portion and the stem portion, and an outer end of the support hole is provided with a small diameter portion so that an extent by which the head portion projects from the support hole is determined by abutting of the large diameter portion with a shoulder surface defined between the small diameter portion of the support hole and a remaining part of the support hole. Also, the closely wound portion preferably extends to an end of the compression coil spring remote from the head portion of the electroconductive needle member, and abuts an electroconductive pad which is connected to an external circuit which may consist of a testing circuit or a relay plate.

To keep the compression coil spring attached to the needle member during the assembly process, and thereby facilitate the assembly process, the electroconductive needle member may further comprise a collar portion formed between the head portion and the stem portion or between the large diameter portion and the stem portion for resiliently engaging an associated coil end of the compression coil spring. Additionally or alternatively, the associated coil end may be soldered or otherwise secured to the collar portion or the stem portion adjacent to the head as the case may be.

To obtain a contact probe unit having two moveable ends in an economical fashion, a free end of the closely wound portion may project out of a second small diameter portion provided in the support hole at the other open end thereof while an inner diameter of the second small diameter portion is larger than the free end of the closely wound portion but smaller that a remaining part of the closely wound portion.

To fully implement a contact probe unit having two moveable ends both of which are capable to cleaning the parts to be accessed or capable of penetrating a layer of oxide film or other foreign matters that may deposit on the parts to be accessed, the compression coil spring may include an intermediate closely wound portion, and a pair of coarsely wound portion on either axial end thereof so that one end of the compression coil spring engages the first mentioned electroconductive needle member while the other end of the compression coil spring engages a second electroconductive needle member which similarly includes a head portion projecting out of the other end of the support hole, both the first and second electroconductive needle members being provided with respective stem portions which are adapted to contact the closely wound portion at least when the compression coil spring is compressed to a certain extent.

BRIEF DESCRIPTION OF DRAWINGS

Now the present invention is described in the following with reference to the appended drawings, in which.

BEST MODE FOR CARRYING OUT THE INVENTION

Figure 1:
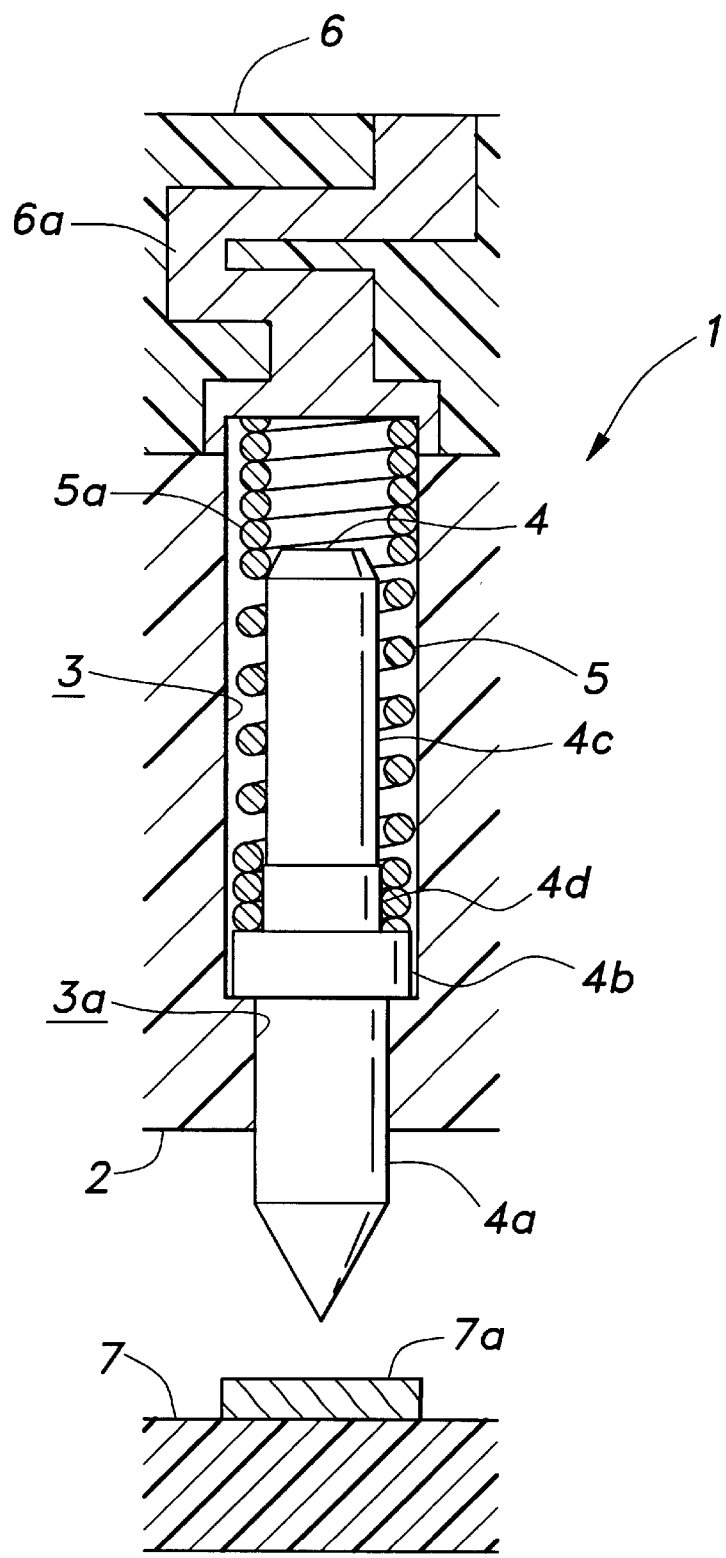
FIG. 1 is a simplified sectional side view of an electroconductive contact probe unit embodying the present invention.

FIG. 1 shows a simplified sectional side view of a contact probe unit embodying the present invention. This electroconductive contact unit 1 is typically used in a large number in a parallel relationship for simultaneously accessing a plurality of points of an object to be tested. However, it is also possible to use the electroconductive contact unit 1 individually. In this and other drawings, the lateral dimensions are exaggerated with respect to the vertical dimensions for the convenience of illustration, and it should be understood that the drawings do not indicate the actual dimensions of the contact probe units embodying the present invention.

In this electroconductive contact unit 1, a holder is defined by forming a support hole 3 which is passed depthwise through an insulating support plate 2, and an electroconductive needle member 4 is coaxially received in the support hole 3. The electroconductive needle member 4 is urged by a compression coil spring 5 in the direction to project out of the support hole 3. On the upper surface of the support plate 2 as seen in the drawing is securely laminated a relay plate 6 for transmitting electric signals which integrally incorporates an electroconductive path 6a for transmitting electric signals across the relay plate 6.

A testing circuit board may be placed over the relay plate 6, and the same assembly may be adapted to different objects to be tested having different wiring patterns and terminal layouts by selecting suitably adapted relay plates.

The electroconductive needle member 4 comprises a head portion 4a adapted to engage an object to be tested, a large diameter portion 4b formed in a rear end of the head portion 4a, and a stem portion 4c extending from the large diameter portion 4b away from the head portion 4a, all of them arranged in a coaxial relationship. The support hole 3 receives the large diameter portion 4b of the electroconductive needle member 4, and the compression coil spring 5 which is coaxially wound around the stem portion 4b. The support hole 3 includes a small diameter portion 3a which slidably receives the head portion 4a, but a shoulder surface defined between the small diameter portion 3a and the rest of the support hole 3 abuts the large diameter portion 4b to thereby restrict the projecting movement of the electroconductive needle member 4.

The forward end of the head portion 4a is formed as a pointed end in the illustrated embodiment, but the shape of the forward end of the head portion 4a can be selected as required according to the shape and material of each particular object to be tested. For instance, when a solder ball is to be accessed, the forward end of the head portion 4a may consist of a planar end surface instead of a pointed end.

As mentioned above, the compression coil spring 5 wound around the stem portion 4c is installed between the large diameter portion 4b and the relay plate 6 in a prestressed condition. In the illustrated embodiment, a collar portion 4d having a slightly larger diameter than the inner diameter of the compression coil spring 5 is formed in the part of the stem portion 4c adjacent to the large diameter portion 4b so that the associated end of the compression coil spring 5 may resiliently fit onto the collar portion 4d. Therefore, the needle member 4 and the compression coil spring 5 can form an integral assembly before and during the time the needle member 4 is placed into the support hole 3, and the assembly process can be therefore simplified. The compression coil spring 5 may be alternatively or additionally attached to the collar portion 4d by soldering or other additional securing means. It is also possible to simply fit the associated coil end onto the collar portion 4d without any significant resilient deformation of the compression coil spring 5.

The compression coil spring 5 includes a closely wound portion 5a at an end adjacent to the relay plate 6 or the inner end of the electroconductive needle member 4 which shows a closely wound state even under the free condition, and this closely wound portion 5a extends to a part where it slightly overlaps an axial end or an upper end (as seen in the drawing) of the stem portion 4c under the rest condition illustrated in FIG. 1. The compression coil spring 5 has a coil end (lower end as seen in the drawing) which is engaged by a part of the stem portion 4c of the electroconductive needle member 4 adjacent to the large diameter portion 4b or an annular shoulder surface defined between the collar portion 4d and the large diameter portion 4b, and another coil end (upper end as seen in the drawing) consisting of the closely wound portion 5a which is received in a recess 6b (FIG. 3) formed in a part of the electroconductive path 6a of the relay plate 6 facing the support hole 3, and abuts the bottom surface of this recess 6b.

The electroconductive needle member 4 and the compression coil spring 5 may have a processed surface such as a gold plated surface or the like (such as rhodium plating), but may also consist of solid material without any surface processing if the material has favorable electric properties (such as those of precious metal alloys and copper alloys) which would not corrupt the electric signal. If the material consists of precious metal alloys or the like, even when foreign matters such as solder debris deposited on the surface of the electroconductive needle member 4 and oxide film formed over the surface of the solder deposit or the like, the contact resistance can be stabilized simply by shaving off or otherwise removing the oxidized surface.

To allow the compression coil spring 5 to smoothly extend and compress, the inner diameter of the compression coil spring 5 is slightly larger than the outer diameter of the stem portion 4c.

When conducting a test by using this electroconductive contact probe unit 1, the support plate 2 is first lowered toward an object to be tested 7, and the pointed end of the head portion 4a is pushed against a pad 7a to produce a sufficient load to break through oxide film that may be formed on the surface of the pad 7a by compressing the compression coil spring 5. This action is called as a cleaning in the sense that the contact surface is cleaned by the pointed end of the electroconductive needle member 4.

The electric signal obtained during the testing process is transmitted from the pad 7a to the electroconductive path 6a via the electroconductive needle member 4 and the compression coil spring 5. Because the inner diameter of the compression coil spring 5 is slightly larger than the outer diameter of the stem portion 4c, the compression of the compression coil spring 5 causes the compression coil spring 5 to snake or otherwise curve along the length of the support hole 3 with the result that a part of the inner circumferential surface of the closely wound portion 5a contacts the outer circumferential surface of the stem portion 4c.

Figure 2:
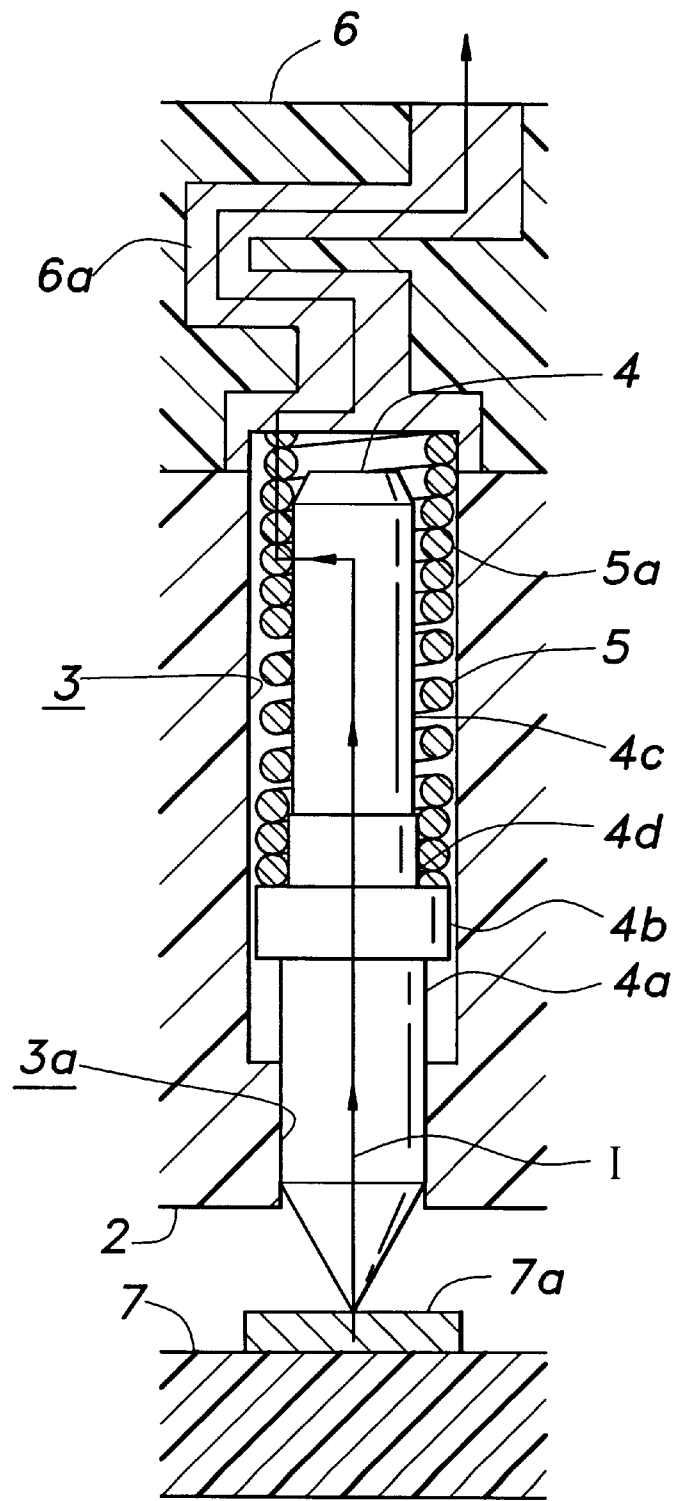
FIG. 2 is a view similar to FIG. 1 showing the electroconductive contact probe unit in its operative state.

Therefore, the electric signal which is transmitted from the electroconductive needle member 4 to the compression coil spring 5 can be conducted axially through the closely wound portion 5a as shown in FIG. 2 because the electroconductive needle member 4 is brought into contact with the closely wound portion 5a as mentioned above, instead of conducting the electric signal through a spiral path along a coarsely wound portion of the compression coil spring 5, and thereby suffering from the increases in the inductance and the electric resistance.

Under the rest condition illustrated in FIG. 1, the inner end of the stem portion 4c barely overlaps the closely wound portion 5a, but it is also possible to have them overlap each other more significantly. In either case, as soon as the electroconductive needle member 4 is brought into contact with the pad 7a and is pushed into the holder to any depth, the stem portion 4c is allowed to come into contact with the closely wound portion 5a even when the deformation of the compression coil spring 5 varies from one contact probe unit to another due to the irregularities in the surface levels of the accessed parts of the object to be tested.

Figure 3:
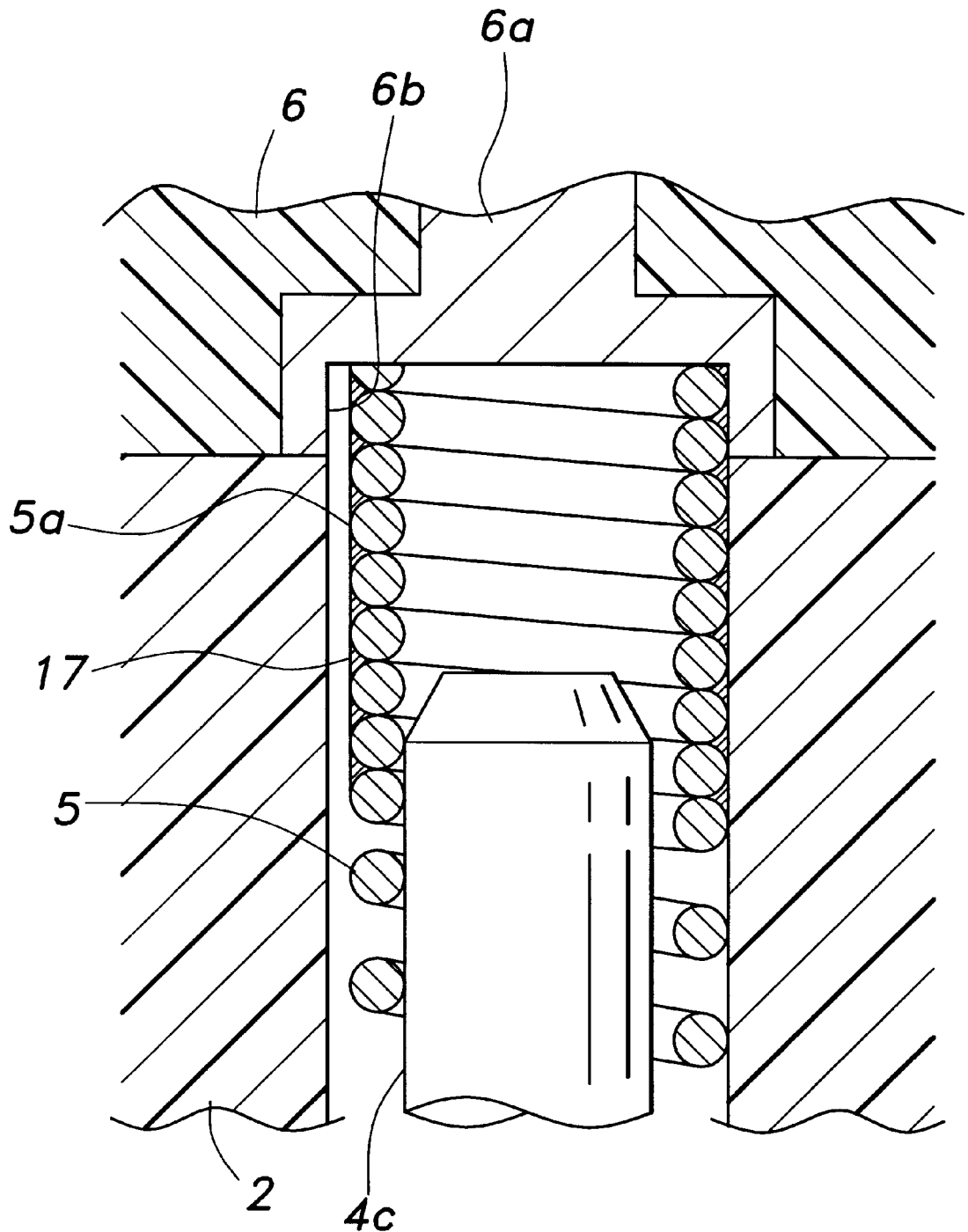
FIG. 3 is an enlarged sectional view of an alternate embodiment of the compression coil spring.

It is also possible to form electroconductive film ovre the outer circumferential surface of the closely wound portion 5a of the compression coil spring 5 by using solder or the like as indicated by numeral 17 in FIG. 3. By so doing, the closely wound portion 5a is practically formed into a solid tube, and this can stabilize the electric property of the contact probe unit even further.

Figure 4:
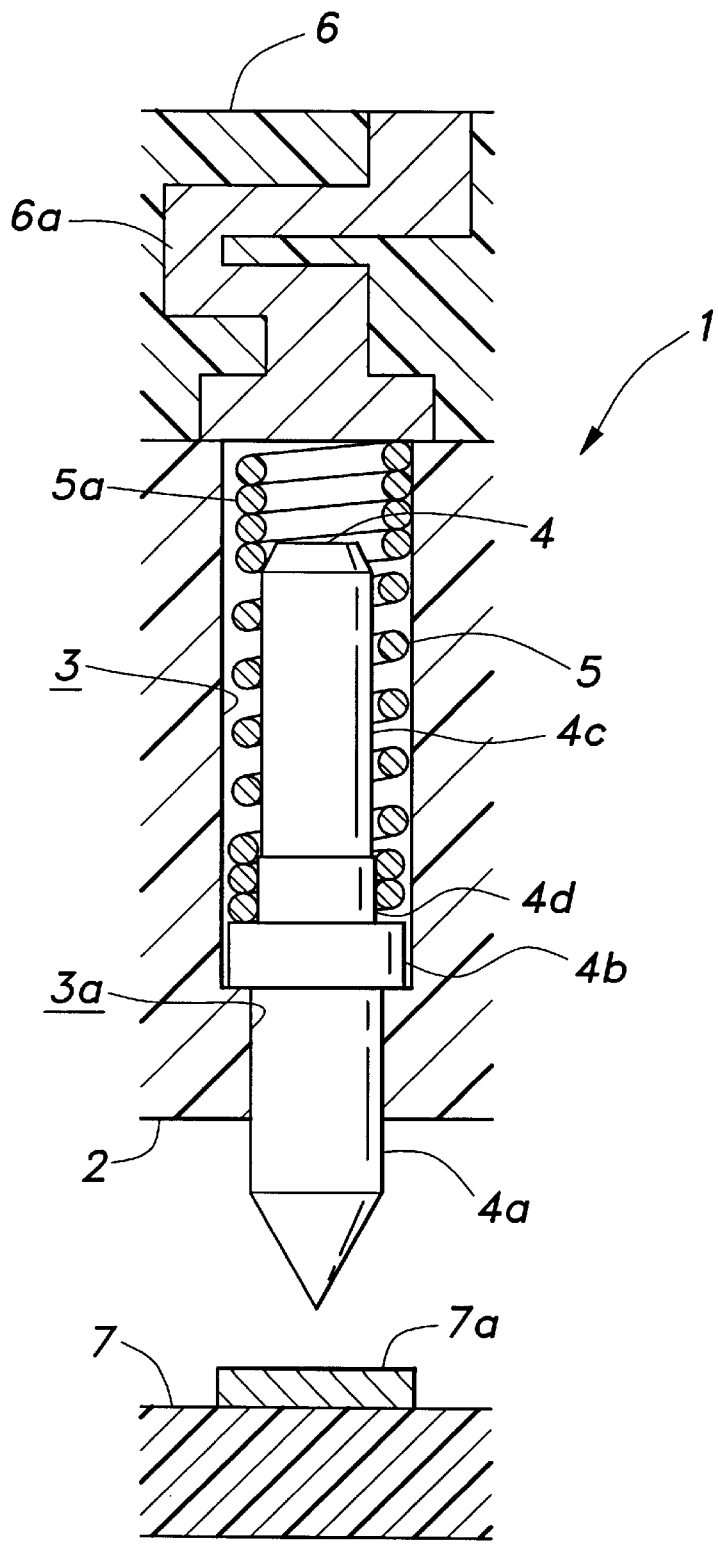
FIG. 4 is a view similar to FIG. 1 showing a second embodiment of the electroconductive contact probe unit according to the present invention.

A part of the electroconductive path 6a facing the support hole 3 was recessed so as to receive a coil end of the closely wound portion 5a in the illustrated embodiment, but the surface of the electroconductive path 6a facing the support hole 3 may also consist of a planar surface which is flush with the bonding surface between the relay plate 6 and the support plate 2 as illustrated in FIG. 4. In FIG. 4, the parts corresponding to those of the previous embodiment are denoted with like numerals without repeating the description of such parts.

In both the first embodiment and the embodiment illustrated in FIG. 4, the electroconductive path 6a and the closely wound portion 5a may be joined by solder. In this case, the electric property of the contact probe unit can be even further stabilized. Although the coil ends of the compression coil springs 5 were ground into planar surfaces in the illustrated embodiments, the grinding of the coil ends may be omitted particularly when the coil wire diameter is relatively small.

Figure 5:
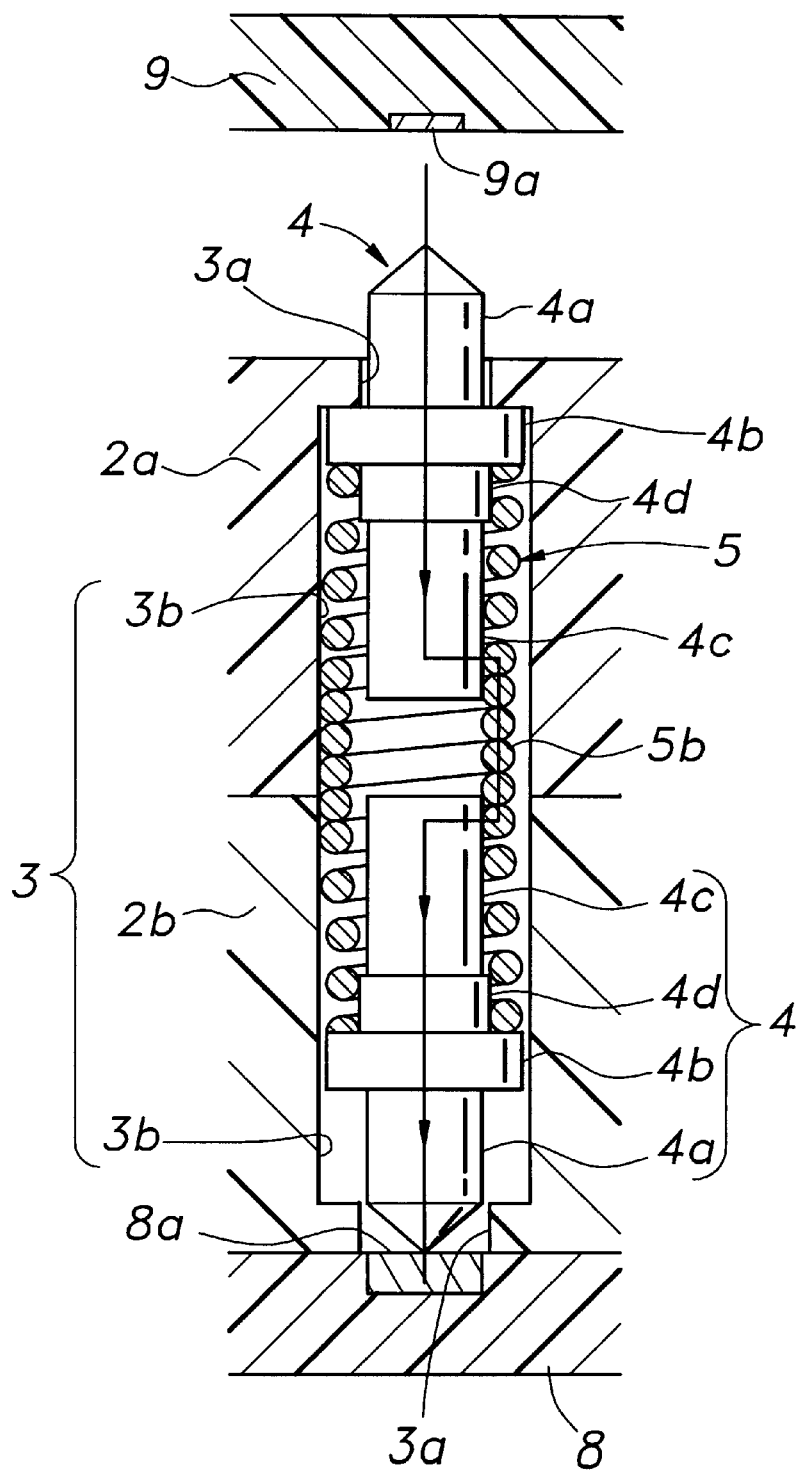
FIG. 5 is a simplified sectional side view of an electroconductive contact probe unit having two moveable ends embodying the present invention.

FIG. 5 shows another embodiment of the present invention which consists of a contact probe unit having two moveable ends, and the parts corresponding to those of the previous embodiment are denoted with like numerals without repeating the description of such parts.

According to the embodiment shown in FIG. 5, not only an electroconductive needle member 4 similar to that of the previous embodiment is attached to a coil end of the compression coil spring 5, but also another electroconductive needle member 4 which may be identically shaped is attached to the other coil end of the compression coil spring 5 in a coaxial and symmetric relationship. The electroconductive needle members 4 are disposed in such a manner that their head portions 4a face away from each other. The holder in this case includes a support plate 2 formed by a pair of support plate segments 2a placed one over the other so as to receive the compression coil spring 5 and support the two electroconductive needle members 4.

The two support plate segments 2a are provided with symmetrically shaped support holes 3b so as to jointly form a single support hole 3 when the two support plate segments 2a are placed one over the other as illustrated in FIG. 5, and the compression coil spring 5 is received coaxially in the jointly formed support hole 3.

The outer end of each of the support holes 3a facing away from the bonding surface between the two support plate segments 2a is provided with a coaxial small diameter portion 3a which is reduced in diameter from the remaining larger diameter portion of the support hole 3 receiving the compression coil spring 5. Similarly as the previous embodiments, a cylindrical part of the head portion 4a of each of the electroconductive needle members 4 is axially slidably received in the corresponding small diameter portion 3a.

There is a gap between the cylindrical portion of each head portion 4a and the corresponding support hole 3 in the drawing, but it is only intended to show that the inner diameter of the small diameter portion 3a of the support hole 3 is larger than the outer diameter of the cylindrical part of the head portion 4a, and it does not mean that the drawing represents the actual dimensions. The same is true with other illustrated embodiments.

Each of the electroconductive needle members 4 additionally comprises a larger diameter portion 4b, a stem portion 4c, and a collar portion 4d formed between them, similarly as the previous embodiments. The two coil ends of the compression coil spring 5 may be resiliently fitted onto the collar portions 4d of the corresponding electroconductive needle members 4 and/or fixedly secured to them by soldering. Because the compression coil spring 5 is received in the support hole 3 in a compressed state, the large diameter portions 4b abut shoulder surfaces defined by the large diameter portions and the small diameter portions 3a of the support hole 3 so that the two electroconductive needle members 4 are prevented from completely projecting out of the support hole 3.

The parts of the compression coil spring 5 surrounding the stem portions 4c consist of coarsely wound portions, but the part of the compression coil spring 5 extending between the two electroconductive needle members 4 consists of a closely wound portion 5b. The axial length of the intermediate closely wound portion 5b is selected such that the closely wound portion 5b abuts the stem portions 4c of the two electroconductive needle members 4 under the rest condition (when the two electroconductive needle members 4 are not brought into contact with objects to be tested). Because the compression coil spring 5 curves as it is compressed, the intermediate closely wound portion 5b contacts the stem portions 4c.

Referring to FIG. 5, a circuit board 8 which may consist of a burn-in board or the like is placed in a lower part, and one of the electroconductive needle members or the lower electroconductive needle member 4 is brought into contact with a wiring pattern 8a having a surface which is flush with the upper surface of the circuit board 8. During the testing process, the other or upper electroconductive needle member 4 is brought close to an object to be tested which is placed in an upper part of the drawing, and the other electroconductive needle member 4 is resiliently brought into contact with a testing pad 9a of an object 9 to be tested. In this state, both the electroconductive needle members 4 are disposed in a similar state as that shown in the lower part of FIG. 5.

Therefore, the electric signal obtained during the testing process is conducted as indicated by solid arrow in FIG. 5, or from the testing pad 9a to the wiring pattern 8a via the upper electroconductive needle member 4, the stem portion 4a thereof, the intermediate closely wound portion 5b, the stem portion 4a of the lower electroconductive needle member 4, and the lower electroconductive needle member 4. The only part of the path of electric conduction passing through the compression coil spring 5 consists of the closely wound portion 5b, and the electric current can therefore pass linearly and axially through the compression coil spring 5, instead of passing through a spiral path along a coarsely wound portion of the compression coil spring 5, and thereby suffering from the increases in the inductance and the electric resistance.

Figure 6:
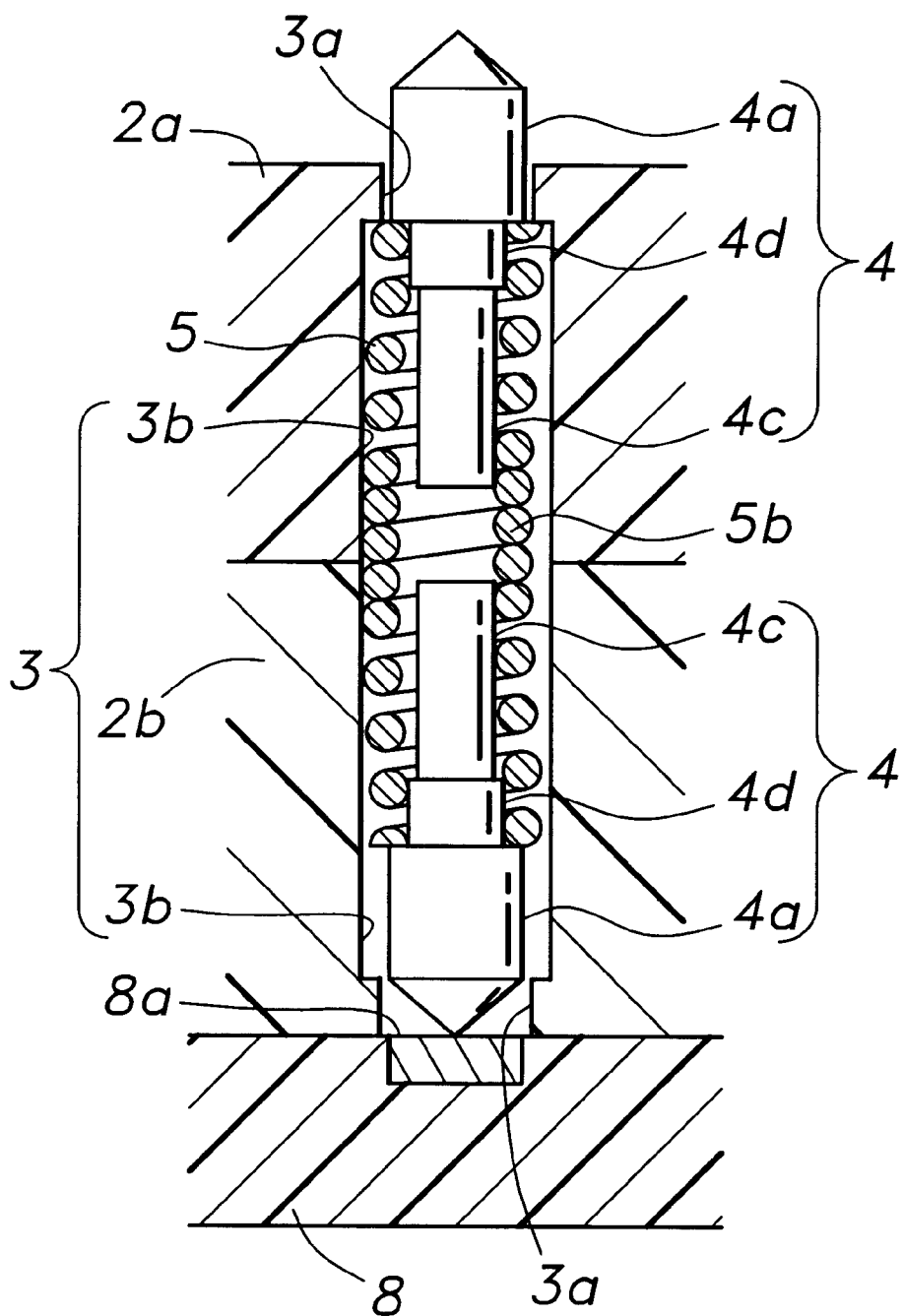
FIG. 6 is a view showing an embodiment modified from that of FIG. 5.

FIG. 6 shows yet another embodiment in which the large diameter portion 4b of each of the electroconductive needle members 4 is omitted, and the parts corresponding to those of the previous embodiments are denoted with like numerals without repeating the description of such parts. In this case, the electroconductive needle members 4 are prevented from completely projecting out of the support hole 3 by coil ends of the compression coil spring 5 abutting the shoulder surfaces defined between the associated small diameter portions 3a and the remaining part of the support hole 3. According to this embodiment, increases in the inductance and the electric resistance due to the conduction of an electric signal through a spiral path can be avoided similarly as the previous embodiments, and, additionally, the overall length of the electroconductive needle members 4 can be reduced at least by the length of the large diameter portion 4b. Also, because the shape of the electroconductive needle members 4 can be simplified, and this contributes to the reduction in the cost of the component part.

The present invention may also be embodied as illustrated in FIG. 7, and, again, the parts corresponding to those of the previous embodiments are denoted with like numerals without repeating the description of such parts. According to the embodiment illustrated in FIG. 7, instead of one of the electroconductive needle members 4 of the embodiment illustrated in FIG. 5, an end of the compression coil spring 5 is used for accomplishing the same purpose. The end of the compression coil spring 5 remote from the single electroconductive needle member 4 is reduced in diameter from the rest of the compression coil spring 5, and additionally consists of a closely wound portion 5c.

Figure 7:
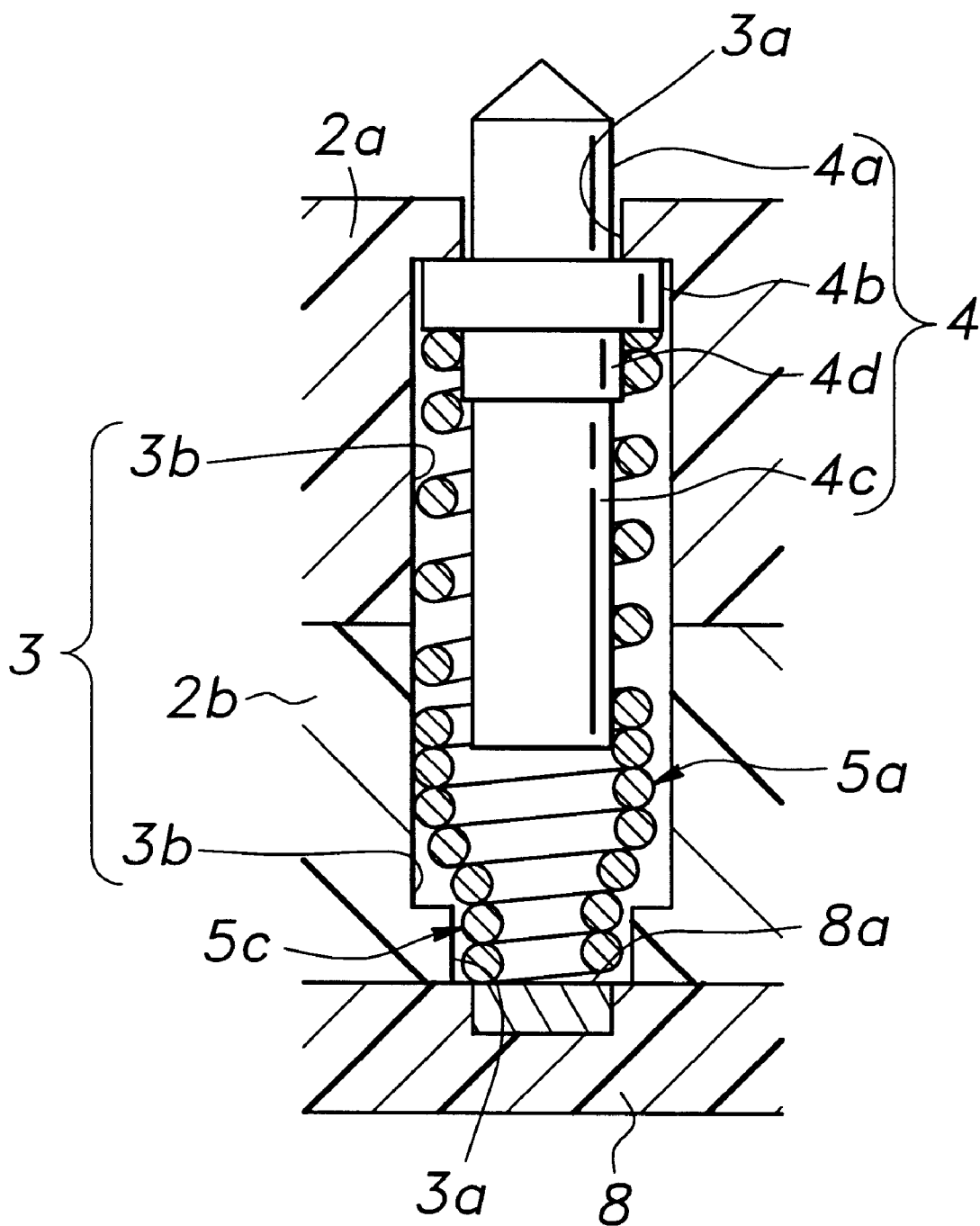
FIG. 7 is a view showing another embodiment modified from that of FIG. 5.

Thus, according to the embodiment illustrated in FIG. 7, in use, the reduced-diameter closely wound portion 5c formed at one end of the compression coil spring 5 is brought into contact with the wiring pattern 8a. Also, in this compression coil spring 5, the closely wound portion extends from the reduced-diameter closely wound portion 5c to the intermediate closely wound portion 5a substantially without any break.

In the embodiment illustrated in FIG. 7 also, because the closely wound portion 5a of the compression coil spring 5 contacts the stem portion 4c of the upper electroconductive needle member 4, and the electric signal can therefore pass through the closely wound portion 5a, the path of electric conduction extends axially along the length of the compression coil spring 5, and the increases in the inductance and the electric resistance due to the conduction of the signal through a spiral path can be avoided. The embodiment illustrated in FIG. 7 is advantageous when only one end is required to have a cleaning capability, and can allow the cost to be reduced.

Thus, according to the present invention, because the electric signal is conducted through a closely wound portion, even when the number of turns of the coarsely wound portion is relatively large for producing the necessary resilient force, the electric signal is not conducted through the coarsely wound portion so that the inductance and the electric resistance can be favorably reduced. Also, because the spring property (such as the number of turns of the coarsely wound portion) can be determined without being dictated by the concern to avoid increases in the inductance and the electric resistance, it is possible to realize a favorable contact probe design even when the moving stroke of the electroconductive needle member is relatively large.

What is claimed is:

1. A contact probe unit, comprising:

a support hole passed through a support member;

an electroconductive needle member slidably received in said support hole, said needle member including a head portion projecting out of an end of said support hole, and a stem portion extending from said head portion coaxially and away from an end of said head portion projecting out of said support hole; and a compression coil spring coaxially received in said support hole so as to urge said head portion out of said support hole;

said compression coil spring including a closely wound portion in which adjacent turns of said compression coil spring contact each other at least when said compression coil spring is compressed to a certain extent;

said closely wound portion has an outer diameter substantially smaller than an inner diameter of a corresponding part of said support hole so that said closely wound portion curves as said compression coil is compressed;

said stem portion overlapping said closely wound portion of said compression coil spring so that said stem portion comes into contact with said closely wound portion when said compression coil spring is compressed and said closely wound portion has thereby curved at least to a certain extent.

2. A contact probe unit according to claim 1, wherein said closely wound portion is located in such a manner that said closely wound portion axially overlaps a rear end of said electroconductive needle member under a rest condition where said electroconductive needle member is not in contact with any object.

3. A contact probe unit according to claim 1, wherein electroconductive film is deposited around said closely wound portion to form said closely wound portion into a substantially integral tube.

4. A contact probe unit according to claim 1, wherein said electroconductive needle member further comprises a large diameter portion between said head portion and said stem portion, and an outer end of said support hole is provided with a small diameter portion so that an extent by which said head portion projects from said support hole is determined by abutting of said large diameter portion with a shoulder surface defined between said small diameter portion of said support hole and a remaining part of said support hole.

5. A contact probe unit according to claim 1, wherein said electroconductive needle member further comprises a collar portion formed between said head portion and said stem portion for resiliently engaging an associated coil end of said compression coil spring.

6. A contact probe unit according to claim 4, wherein said electroconductive needle member further comprises a collar portion formed between said large diameter portion and said stem portion for resiliently engaging an associated coil end of said compression coil spring.

7. A contact probe unit according to claim 1, wherein said closely wound portion extends to an end of said compression coil spring remote from said head portion of said electroconductive needle member, and abuts said electroconductive part of said replay plate.

8. A contact probe unit, comprising:
a support hole passed through a support member and having a first end and a second end;
a first electroconductive needle member slidably received in said support hole, said needle member including a head portion projecting out of said first end of said support hole, and a stem portion extending from said head portion coaxially and inwardly away from said first end of said head portion projecting out of said support hole;
a second electroconductive needle member slidably received in said support hole, said needle member including a head portion projecting out of said second end of said support hole, and a stem portion extending from said head portion coaxially and inwardly away from said first end of said head portion projecting out of said support hole; and
a compression coil spring coaxially received in said support hole and engaged between shoulders defined in parts of said first and second electroconductive needle members so as to urge said head portion out of said support hole;
said compression coil spring including an intermediate closely wound portion in which adjacent turns of said compression coil spring contact each other at least when said compression coil spring is compressed to a certain extent, and a pair of closely wound portion on either axial end thereof;
said closely wound portion has an outer diameter substantially smaller than an inner diameter of a corresponding part of said support hole so that said closely wound portion curves as said compression coil is compressed;
said stem portions overlapping said closely wound portion of said compression coil spring so that said stem portions come into contact with said closely wound portion when said compression coil spring is compressed and said closely wound portion has thereby curved at least to a certain extent.

9. A contact probe unit according to claim 8, wherein said closely wound portion is located in such a manner that said closely wound portion axially overlaps a rear end of each electroconductive needle member under a rest condition where neither of said electroconductive needle member is in contact with any object.

10. A contact probe unit according to claim 8, wherein electroconductive film is deposited around said closely wound portion to form said closely wound portion into a substantially integral tube.

11. A contact probe unit according to claim 8, wherein at least one of said electroconductive needle members further comprises a large diameter portion between said head portion and said stem portion and a corresponding outer end of aid support hole is provided with a small diameter portion so that an extent by which said head portion projects from said support hole is determined by abutting of said large diameter portion with a shoulder surface defined between said small diameter portion of said support hole and a remaining part of said support hole.

12. A contact probe unit according to claim 8, wherein at least one of said electroconductive needle members further comprises a collar portion formed between said head portion and said stem portion for resiliently engaging an associated coil end of said compression coil spring.

13. A contact probe unit according to claim 11, wherein said electroconductive needle members further comprises a collar portion formed between said large diameter portion and said stem portion for resiliently engaging an associated coil end of said compression coil spring.

14. A contact probe unit, comprising:
a support hole passed through a support member and having a first end and a second end;
an electroconductive needle member slidably received in said support hole, said needle member including a head portion projecting out of a first end of said support hole, and a stem portion extending from said head portion coaxially and inwardly away from said first end of said head portion projecting out of said support hole;
a compression coil spring coaxially received in said support hole and engaged between a shoulder defined in a part of said electroconductive needle members so as to urge said head portion out of said support hole;
said compression coil spring including a closely wound portion provided adjacent to said second end of said support hole in which adjacent turns of said compression coil spring contact each other at least when said compression coil spring is compressed to a certain extent;
a free end of said closely wound portion projecting out of a second end of said support hole;
said closely wound portion having an outer diameter substantially smaller than an inner diameter of a corresponding part of said support hole so that said closely wound portion curves as said compression coil is compressed;
said stem portions overlapping said closely wound portion of said compression coil spring so that said stem portions come into contact with said closely wound portion when said compression coil spring is compressed and said closely wound portion has thereby curved at least to a certain extent.

15. A contact probe unit according to claim 14, wherein said closely wound portion is located in such a manner that said closely wound portion axially overlaps a rear end of said electroconductive needle member under a rest condition where said electroconductive needle member is not in contact with any object.

16. A contact probe unit according to claim 14, wherein electroconductive film is deposited around said closely wound portion to form said closely wound portion into a substantially integral tube.

17. A contact probe unit according to claim 14, wherein said electroconductive needle member further comprises a large diameter portion between said head portion and said stem portion, and said first end of said support hole is provided with a small diameter portion so that an extent by which said head portion projects from said support hole is determined by abutting of said large diameter portion with a shoulder surface defined between said small diameter portion of said support hole and a remaining part of said support hole.

18. A contact probe unit according to claim 14, wherein electroconductive needle member further comprises a collar portion formed between said head portion and said stem portion for resiliently engaging an associated coil end of said compression coil spring.

19. A contact probe unit according to claim 17, wherein electroconductive needle member further comprises a collar portion formed between said large diameter portion and said stem portion for resiliently engaging an associated coil end of said compression coil spring.

20. A contact probe unit according to claim 4, wherein said closely wound portion includes a reduced diameter portion at a free end thereof, and said second end of said support hole is provided with a small diameter portion so that an extent by which said reduced diameter portion of said closely wound portion projects from said support hole is determined by abutting of a main part of said closely wound portion with a shoulder surface defined between said small diameter portion of said support hole and a remaining part of said support hole.

* * * * *